(12) United States Patent
Celik et al.

(10) Patent No.: US 8,946,871 B2
(45) Date of Patent: Feb. 3, 2015

(54) THERMAL IMPROVEMENT OF INTEGRATED CIRCUIT PACKAGES

(71) Applicant: LSI Corporation, Milpitas, CA (US)

(72) Inventors: Zeki Z. Celik, Milpitas, CA (US); Allen S. Lim, Milpitas, CA (US); Atila Mertol, Milpitas, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/670,579

(22) Filed: Nov. 7, 2012

(65) Prior Publication Data

US 2014/0124918 A1    May 8, 2014

(51) Int. Cl.
*H01L 23/58*    (2006.01)
(52) U.S. Cl.
USPC ........... 257/633; 257/675; 257/706; 257/720; 257/747; 257/796

(58) Field of Classification Search
CPC ....... H01L 23/34; H01L 23/36; H01L 23/345; H01L 23/373
USPC .................. 257/633, 675, 706, 720, 747, 796
See application file for complete search history.

(56) References Cited

U.S. PATENT DOCUMENTS

| | | | |
|---|---|---|---|
| 5,325,265 A * | 6/1994 | Turlik et al. | 361/702 |
| 6,069,023 A * | 5/2000 | Bernier et al. | 438/107 |
| 6,652,665 B1 | 11/2003 | Sachdev et al. | |
| 7,561,436 B2 | 7/2009 | Brandenburg et al. | |
| 2005/0179126 A1* | 8/2005 | Ravi et al. | 257/706 |
| 2009/0218680 A1 | 9/2009 | Celik et al. | |
| 2010/0134582 A1* | 6/2010 | Koroishi et al. | 347/204 |

\* cited by examiner

*Primary Examiner* — Tan N Tran (57) ABSTRACT

An integrated circuit package comprising an active semiconductor device layer and at least one heat-transfer semiconductor layer on the active semiconductor device layer. The heat-transfer semiconductor layer has a coefficient of thermal expansion that substantially matches a coefficient of thermal expansion of the active semiconductor device layer.

20 Claims, 8 Drawing Sheets

THERMAL IMPROVEMENT OF INTEGRATED CIRCUIT PACKAGES

BACKGROUND

Integrated circuit (IC) package heat dissipation is a major challenge due to active semiconductor device shrinkage and increased power requirements of the devices. In some package designs, to provide a heat dissipation pathway, the bottom side of an IC chip, or die, is soldered to metal pads on a device substrate, such as a printed circuit board (PCB). In some cases, however, there is not enough heat dissipation capability, e.g., due to additional heat coming to the PCB from other heat generating devices attached to the PCB. In other designs, the semiconductor device is buried underneath a mold compound which has very low thermal conductivity, resulting in inadequate heat dissipation from the package's top surface. In such designs additional heat dissipation is often provided through the use of metal heat spreaders placed next to the semiconductor device. Unfortunately, such package designs can have unacceptably low reliability, high device failure rates and have higher cost due to the use of metal heat spreaders.

SUMMARY

The present disclosure provides, in one embodiment, an integrated circuit package. The package comprises an active semiconductor device layer and at least one heat-transfer semiconductor layer on the active semiconductor device layer. The heat-transfer semiconductor layer has a coefficient of thermal expansion that substantially matches a coefficient of thermal expansion of the active semiconductor device layer.

Embodiments of the invention manifest in other forms include, but are not limited to, methods of manufacturing an integrated circuit package.

BRIEF DESCRIPTION

Other embodiments of the invention will become apparent from the following descriptions taken in conjunction with the accompanying drawings, in which.

DETAILED DESCRIPTION

For the purposes of the present disclosure, the term, "or," as used herein, refers to a non-exclusive or, unless otherwise indicated.

The present disclosure benefits from the realization that low reliability and high device failure rates can at least in part be caused by the placement of a metal heat spreader on an active semiconductor device layer. In particular, the large mismatch between the coefficient of thermal expansion (CTE) of typical metal heat spreaders and active semiconductor device layers can create stresses in the active semiconductor device layer during its operation, leading to the reliability and failure issues.

It is further recognized as part of the present disclosure that these problems could be mitigated by using a heat transfer semiconductor layer instead of a metal heat spreader. Using a heat transfer semiconductor layer can reduce or, eliminate altogether in some cases, stresses on the active semiconductor device layer due to the substantial matching of CTE of these two material layers. Additionally, the heat transfer semiconductor layer is selected to have a sufficiently high thermal conductivity (k) to provide an adequate heat dissipation pathway.

The disclosed embodiments of the invention can be easily and inexpensively implemented in existing package designs. For instance, often the heat transfer semiconductor layer can be made from left-over scrap material generated as part of the fabrication of the active semiconductor device itself. For instance, the package design and layout does not necessarily have to be altered in order to use the heat transfer semiconductor layer for heat dissipation.

Figure 1:
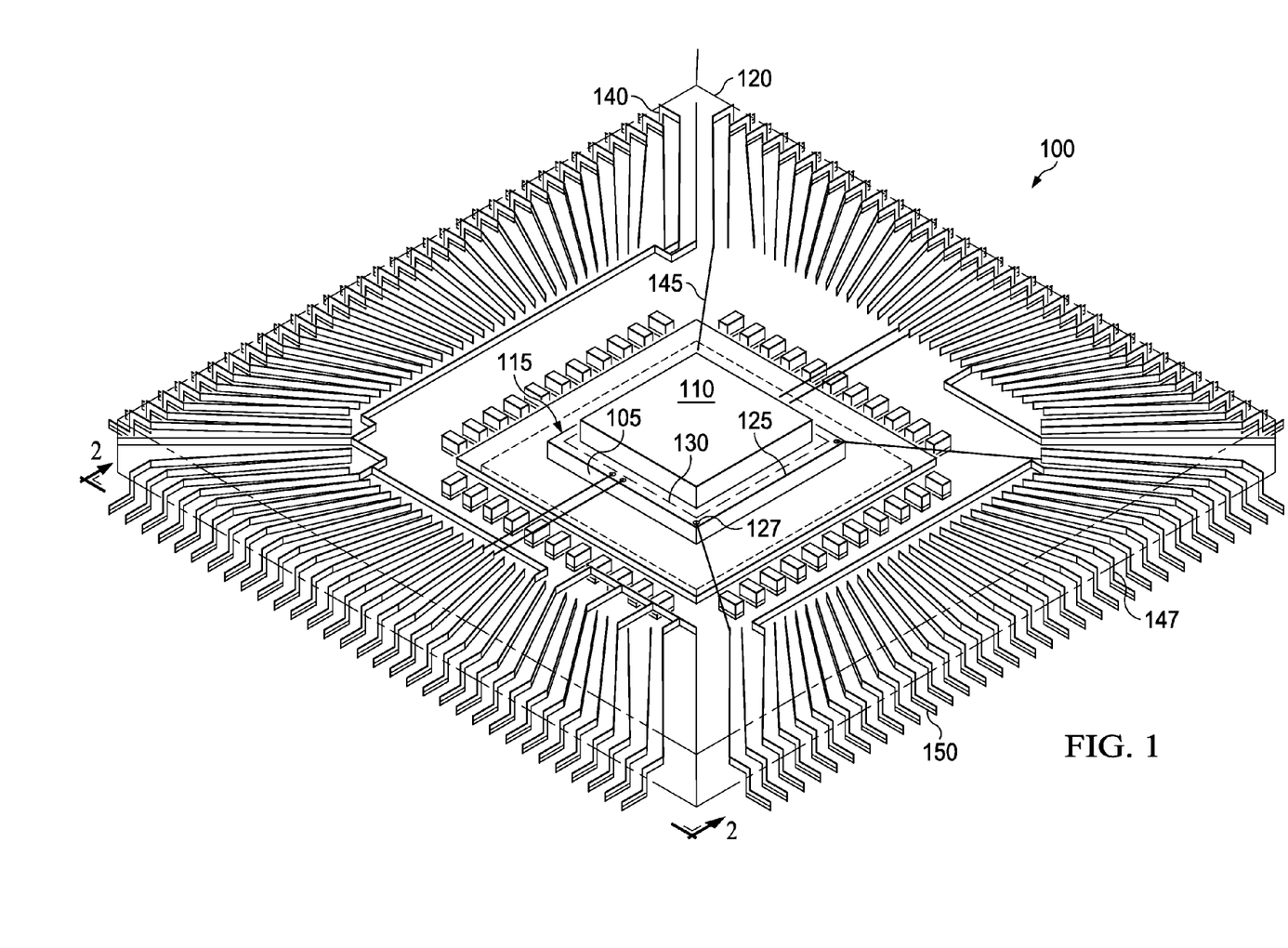
FIG. 1 presents a perspective view of an embodiment of an integrated circuit package of the disclosure.
Figure 2:
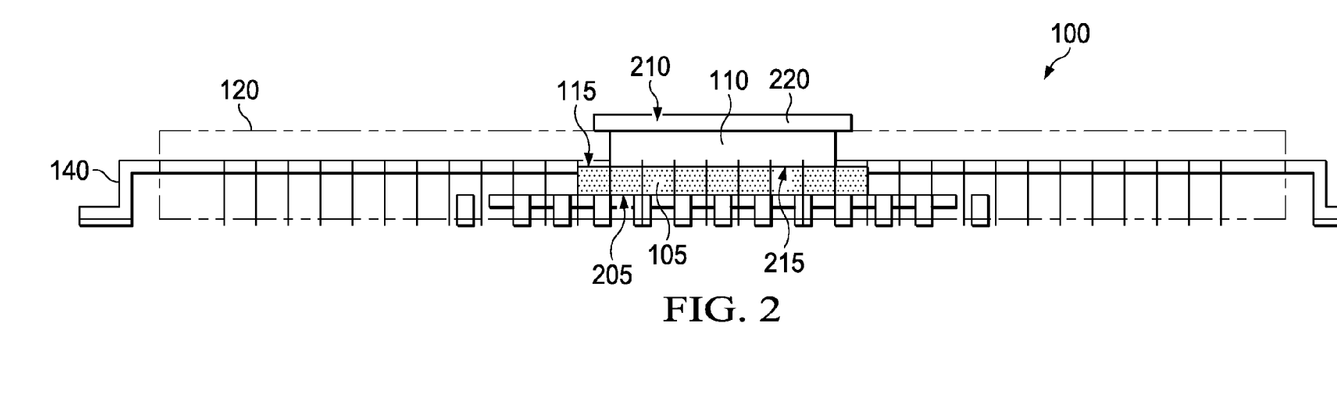
FIG. 2 presents a side view of another embodiment of an integrated circuit package similar to the first embodiment package depicted in FIG. 1 along view line 2 in FIG. 1.

One embodiment of the disclosure is an IC package. FIG. 1 presents a perspective view of an embodiment of the IC package 100 of the disclosure, and, FIG. 2 presents a side view of an alternate embodiment IC package, similar, but not identical, to the embodiment depicted in FIG. 1, along view line 2 in FIG. 1. Non-limiting IC packages include IC packages used in memory, storage and flash devices.

As illustrated in FIGS. 1 and 2, the package 100 comprises an active semiconductor device layer 105 have an active side 115 and an opposite backside 205. The package 100 further comprises at least one heat-transfer semiconductor layer 110 on the active semiconductor device layer 105. The heat-transfer semiconductor layer 110 has a CTE that substantially matches a CTE of the active semiconductor device layer.

This is in contrast to a much larger mismatch in CTE (coefficient of thermal expansion defined as the fractional increase in the length per unit rise in temperature, in units of $\mu m/m/^\circ C.$ or $ppm/^\circ C.$) when using a metal heat spreader, such as a copper heat spreader (CTE equal to about 18 $ppm/^\circ C.$), and a silicon active semiconductor device layer 105 (CTE equal to about 3 $ppm/^\circ C.$).

In some embodiments of the invention, at least one heat-transfer semiconductor layer 110 is located on the active side 115. The term active side as used herein refers to the side of the active semiconductor device layer 105 (e.g., an integrated circuit die) upon which active or passive IC components (e.g., transistors, resistors capacitors or other) are fabricated. The active semiconductor device layer 105 can include one or more digital or analog semiconductor devices, such as DRAM, SRAM and logic circuitry as used in system-on-chip, application specific integrated circuits or circuits familiar to those skilled in the art. In other embodiments of the invention, the at least one heat-transfer semiconductor layer 110 is located on the backside 205. The backside refers to the side of the active semiconductor device layer 105 that is on the opposite side of the layer 105 as the active side.

In some embodiments of the invention, the heat-transfer semiconductor layer 110 can be located directly on the active side 115 or the backside 205 with no intervening material between the active semiconductor device layer 105 and the heat-transfer semiconductor layer 110, resulting in a direct thermal path from the active semiconductor device layer 105 to the external environment through the heat-transfer semiconductor layer 110 only. For instance, the heat-transfer semiconductor layer 110 can be held in place on the active semiconductor device layer 105 by pressure contact provided by a molding material 120. In other embodiments, the heat-transfer semiconductor layer 110 can be attached to the active semiconductor device layer 105 with a thermal epoxy.

As further illustrated in FIGS. 1 and 2, the heat-transfer semiconductor layer 110 can be located on the active semiconductor device layer 105 so as to not interfere with electrical connections between the active device components on the active side 115 and connection lines inside or outside of the package 100. For instance, as illustrated in FIGS. 1 and 2, in some embodiments of the invention, with the one heat-transfer semiconductor layer 110 located on the active side 115, a portion of the active side 115 has a connection zone 125 with a plurality of bond pads 127 (e.g., wire bond pads in some embodiments) thereon and one heat-transfer semiconductor layer 110 substantial covers a remaining portion 130 of the active side 115 that does not overlap with the connection zone 125. For instance, the heat-transfer semiconductor layer 110 can be centered on the remaining portion 130 of the active side 115 which is surrounded by the connection zone 125 located around the perimeter of the active side 115.

As also illustrated in FIG. 2, the heat-transfer semiconductor layer 110 can be fabricated to have a thickness that is large enough to expose at least one side 210 of the heat-transfer semiconductor layer 110 outside of the mold material 120 and thereby provide a heat dissipation pathway to the external environment. For instance, the at least one exposed side 210 the heat-transfer semiconductor layer 110 can be a side that is opposite the side 215 that faces the active semiconductor device layer 105.

Figure 3:
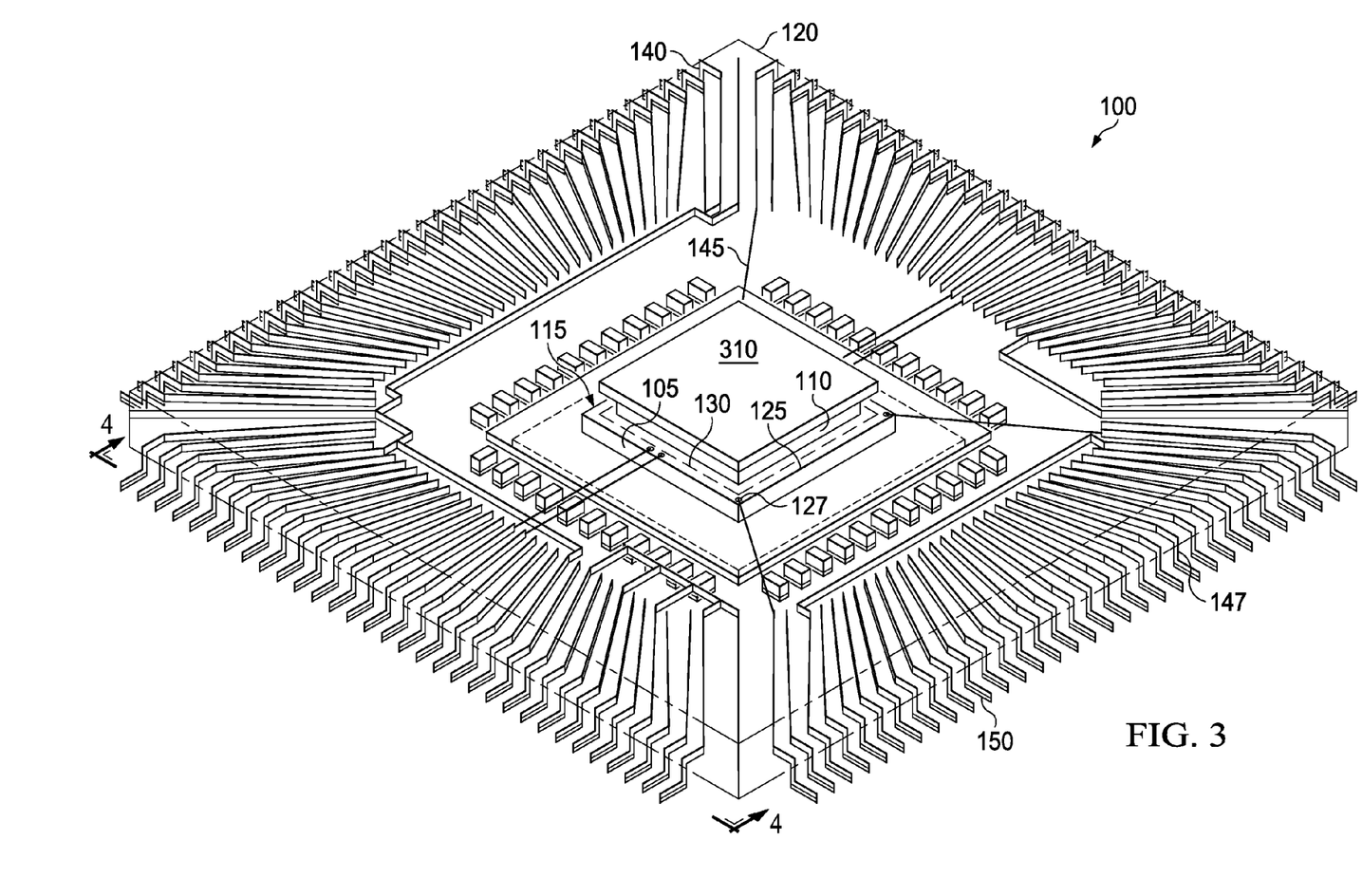
FIG. 3 presents a perspective view of a second embodiment of an integrated circuit package of the disclosure.
Figure 4:
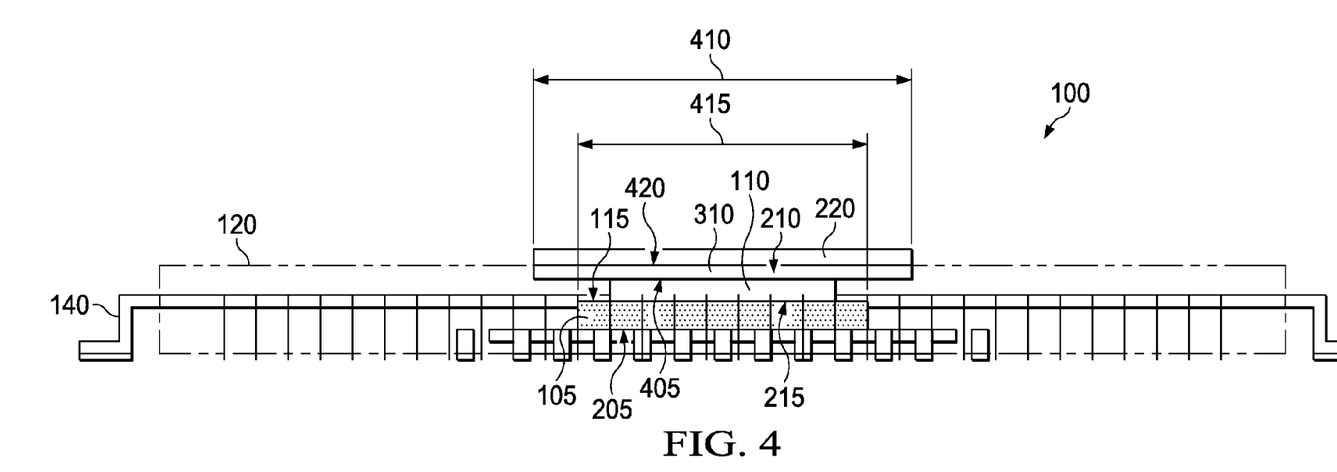
FIG. 4 presents a side view of another embodiment of an integrated circuit package similar to the second embodiment package in FIG. 3 along view line 4 in FIG. 3.

In other embodiments of the invention, the exposed surface can be enlarged through the use of another second heat-transfer semiconductor layer. FIG. 3 presents a perspective view of such an embodiment of the IC package 100 of the disclosure, and, FIG. 4 presents a side view of another embodiment of the invention as an IC package, similar, but not identical, to the package depicted in FIG. 3, along view line 4 in FIG. 3. Any aspects of the package described above in the context of FIGS. 1 and 2 could also be applied to this embodiment of the invention, with the exception being that the heat-transfer semiconductor layer 110 closest to or adjacent to the active semiconductor device layer 105 is not exposed to the environment outside of the mold material 120. Rather, another one of the heat transfer semiconductor layers, e.g. in some embodiments, a second single heat transfer semiconductor layer 310, can be located on the first heat-transfer semiconductor layer 110. In some embodiments of the invention, the one other transfer semiconductor layer 310 can be located directly on the one heat-transfer semiconductor layer 110 with no intervening material, while in other embodiments of the invention, the one other transfer semiconductor layer 310 can be adhered to the one heat-transfer semiconductor layer 110 using a thermal epoxy.

As illustrated in FIG. 4, the other one heat transfer semiconductor layer 310 has a side 405 facing towards the active side 115 of the active semiconductor device layer 105, and that side 405 has a perimeter 410 that is equal to or greater than a perimeter 415 of the active side 115. The opposite side 420 to the side 405 facing towards the active side 115 is exposed outside of the mold material 120 and thereby provides the heat dissipation pathway to the external environment. Providing a second heat transfer semiconductor layer 310 on the first heat transfer semiconductor layer 110 can advantageously improve heat conduction by providing a larger surface area than the surface area of the first heat transfer semiconductor layer 110 while clearing above the wire bonds 127 and bond wires 145 on the active side 115.

Figure 5:
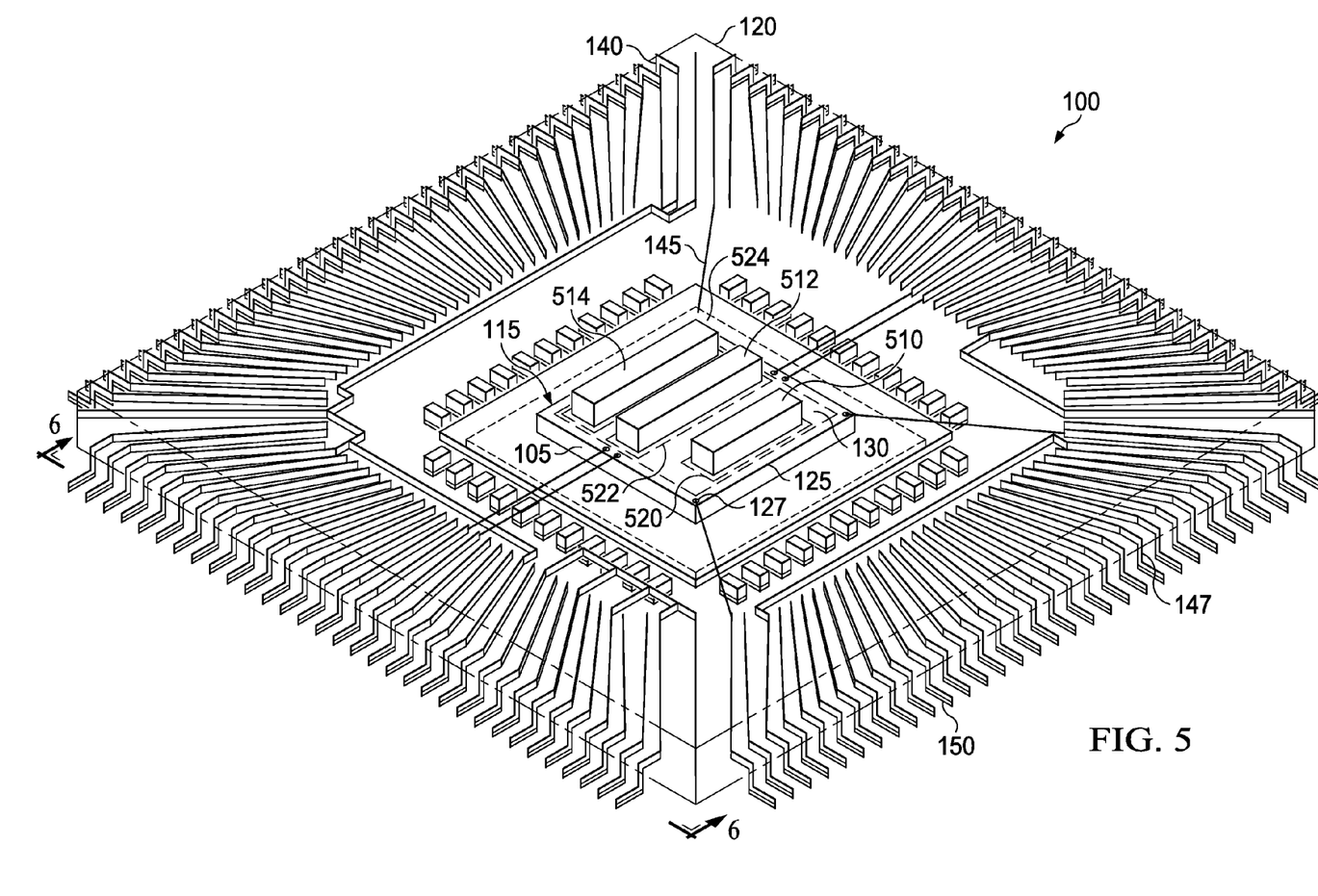
FIG. 5 presents a perspective view of a third embodiment of an integrated circuit package of the disclosure.
Figure 6:
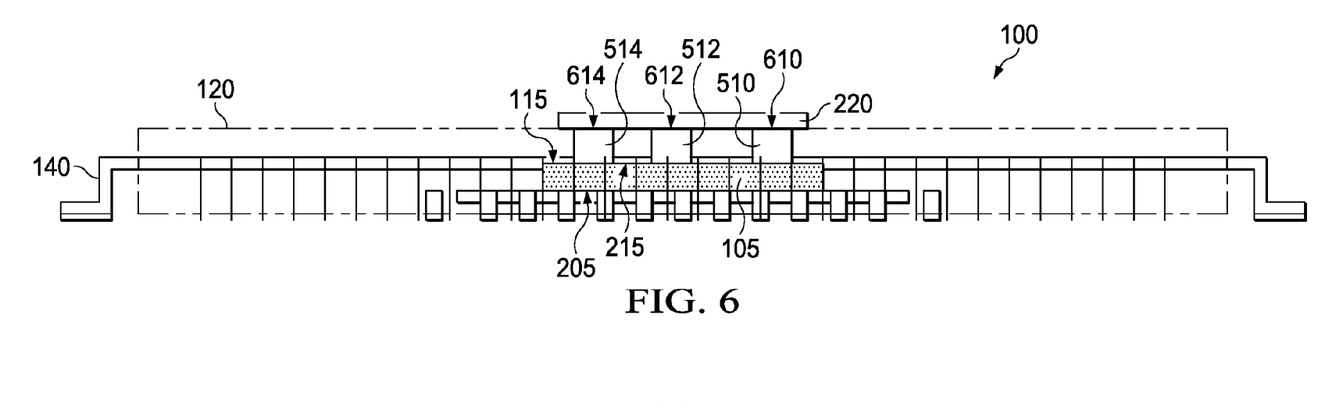
FIG. 6 presents a side view of another embodiment of an integrated circuit package similar to the third embodiment depicted in FIG. 5 along view line 6 in FIG. 5.

In still other embodiments of the invention, heat dissipation from the active semiconductor device layer 105 can be tailored by placing a plurality of different heat-transfer semiconductor layers on the active semiconductor device layer 105. FIG. 5 presents a perspective view of such an embodiment of the invention, and, FIG. 6 presents a side view of another embodiment of the invention as an IC package, similar, but not identical, to the package depicted in FIG. 5, along view line 6 in FIG. 5. Any aspects of the package described above in the context of FIGS. 1 and 2 could also be applied to this embodiment of the invention, with the exception being that there is a plurality of the heat-transfer semiconductor layers (e.g., layers 510, 512, 514) on the active side 115. For instance, in some embodiments of the invention a portion of the active side 115 has the connection zone 125 with the plurality of bond pads 127 thereon and the plurality heat-transfer semiconductor layers 510, 512, 514 are located on the remaining portion 130 of the active side 115. Although FIGS. 5 and 6 depict three heat-transfer semiconductor layers 510, 512, and 514, the number of layers could range from two to a larger number, e.g., from two to ten or two to twenty, or from two to even larger numbers, depending on factors such as, but not limited to, the size of the active side 115 and the extent of heat dissipation tailoring desired.

For instance, in some embodiments of the invention it is desirable to provide a number of heat-transfer semiconductor layers 510, 512, 514 that is equal to a number of specific hot spot areas 520, 522, 524 on the active side 115. That is, each one of the heat-transfer semiconductor layers 510, 512, 514 covers a different one of a plurality of hot-spots 520, 522, 524, respectively, within the remaining portion 130 on the active side 115.

In some embodiments of the invention, hot spot areas are defined as discrete sub-areas on the active side 115 having a temperature that is above an absolute upper maximum recommended or safe operating surface temperature of the active semiconductor devices on the active side 115. In other embodiments of the invention, as non-limiting examples, a customer or IC manufacturer stipulates an upper operating temperature limit, such as not to exceed about 85° C., or to exceed about 100° or to exceed about 105° C. In such embodiments of the invention, any temperature on the active side 115 exceeding upper operating temperature limit is considered a hot-spot.

In other embodiments of the invention, hot spot areas are defined as discrete sub-areas on the active side 115 having a temperature that is significantly higher than a temperature of other areas, or an average temperature, the active side 115. For instance, the hotspot areas correspond to areas of large temperature gradients on the side 115. Where large temperature gradients occur, the absolute temperature of the hot spots may not necessarily exceed a rated upper operating temperature limit. That is, the presence of the large temperature gradients of the active side 115 centered around the hot-spots 520, 522, 524 can undesirably impart stresses in the active semiconductor device layer 105, and these stresses can be mitigated through the placement of the heat-transfer semiconductor layers 510, 512, 514. In some embodiments of the invention, as non-limiting examples, one or more of the hot-spots 520, 522, 524, in the absence of the heat-transfer semiconductor layers 510, 512, 514, can be greater than about 10° C., and in some cases greater than about 20° C., and in some cases greater than about 30° C. than a lowest temperature area (e.g., a relative coldest-spot) on the active side 115. In comparison, in the presence of the heat-transfer semiconductor layers 510, 512, 514, covering the hot-spots 520, 522, 524, a temperature difference between each of the hot-spots 520, 522, 524 and the coldest spot can be reduced by up to about 5° C., and in some cases up to about 10° C., and in some case up to about 20° C.

As also illustrated in FIG. 6, the heat-transfer semiconductor layers 520, 522, 526 can each be fabricated to have a thickness that is large enough to expose at least one side 610, 612, 614 outside of the mold material 120 and thereby provide the heat dissipation pathway to the external environment, analogous that discussed in the context of FIG. 2.

Figure 7:
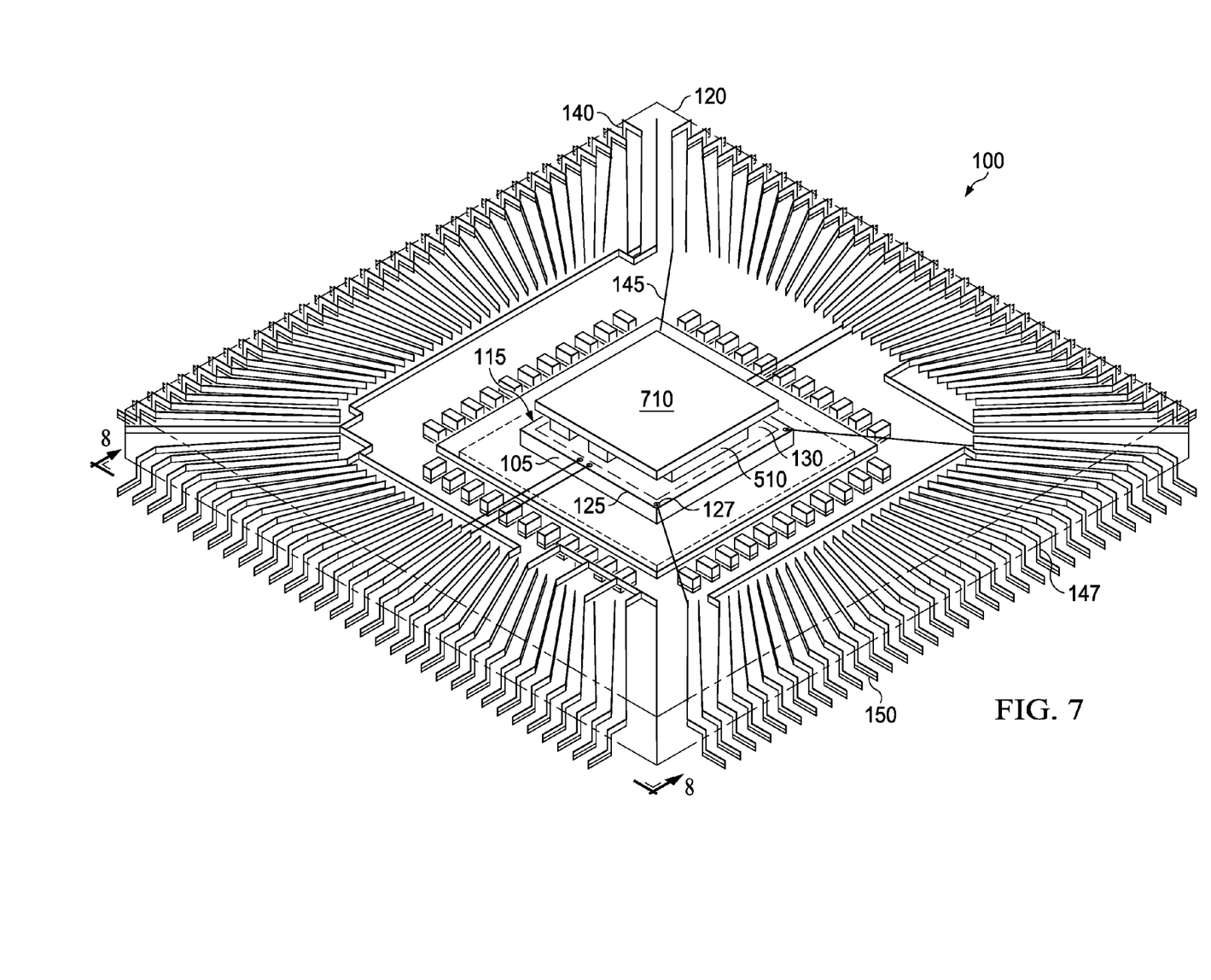
FIG. 7 presents a perspective view of a fourth embodiment of an integrated circuit package of the disclosure.
Figure 8:
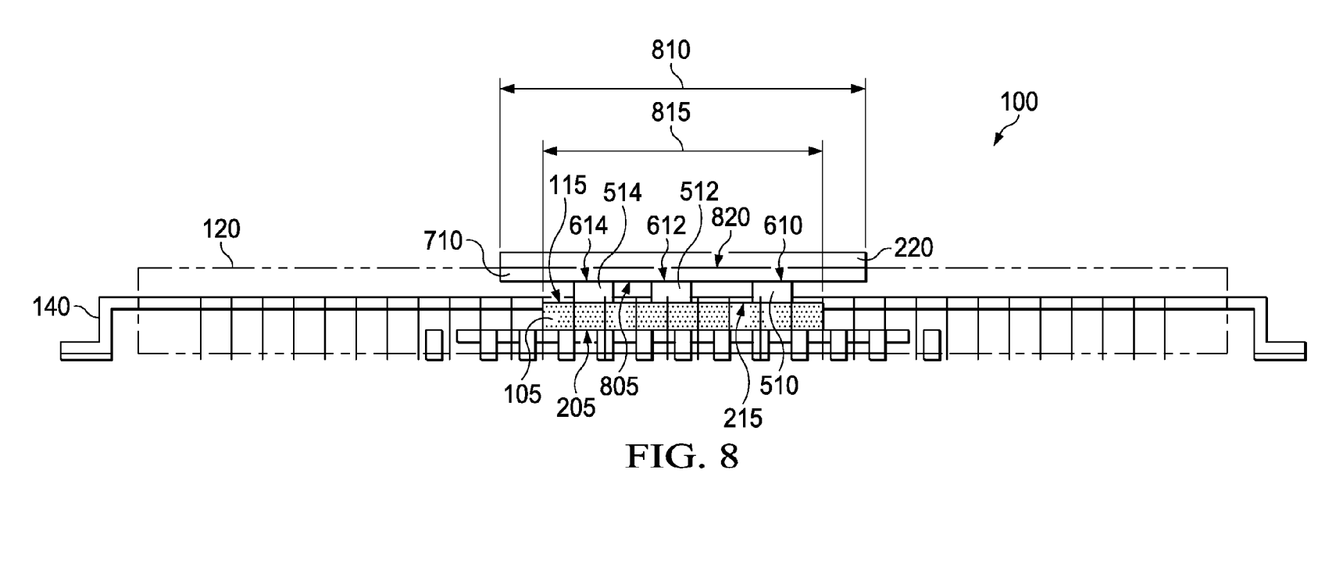
FIG. 8 presents a side view of another integrated circuit package similar to the fourth embodiment in FIG. 7 along view line 8 in FIG. 7.

In other embodiments of the invention, these exposed surfaces 610, 612, 614 can be enlarged through the use of another heat-transfer semiconductor layer. FIG. 7 presents a perspective view of such an embodiment of the invention as an IC package 100, and, FIG. 8 presents a side view of another IC package similar, but not identical, to the package depicted in FIG. 7, along view line 8 in FIG. 7. Any aspects of the package described above in the context of FIGS. 1 and 2 could also be applied to this embodiment of the invention, with the exception being that the heat-transfer semiconductor layers 520, 522, 524 closest to or adjacent to the active semiconductor device layer 105 are not exposed to the environment outside of the mold material 120. Rather, another one of the heat transfer semiconductor layers 710 is located on the heat-transfer semiconductor layers 520, 522, 524, analogous to that discussed in the context of FIG. 3. For instance, in some embodiments of the invention, the other layer 710 has a side 805 facing the active side 115, the side 805 having a perimeter 810 that is equal to or greater than a perimeter 815 of the active side 115 and an exposed opposite site 820 that is not covered by the mold material 120.

Figure 9:
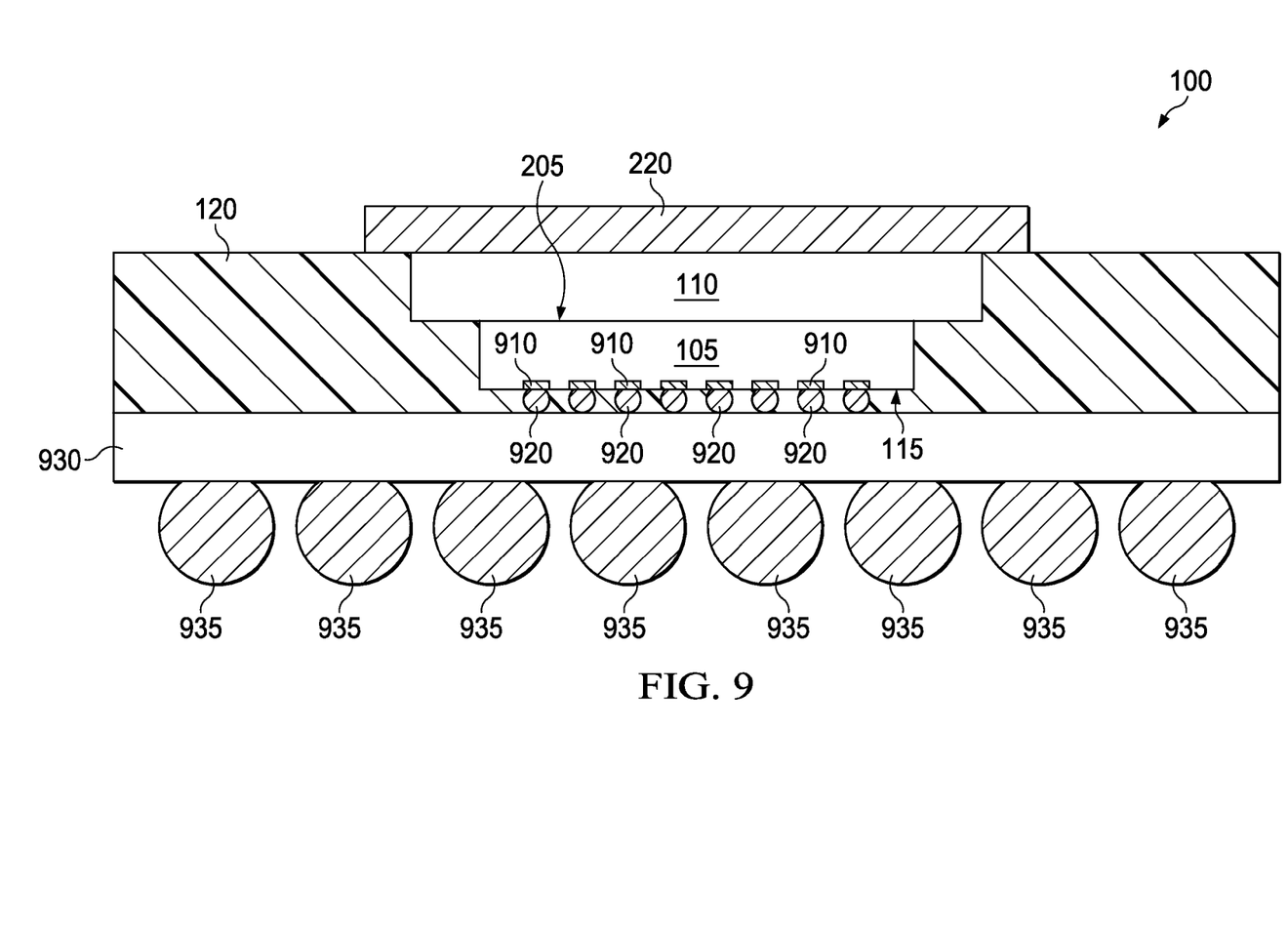
FIG. 9 presents a cross-sectional view of a fifth embodiment of an integrated circuit package of the disclosure.

As noted above, in some embodiments of the invention as an IC package, the heat-transfer semiconductor layer or layers can be located on the backside 205 of the active semiconductor device layer 105. FIG. 9 presents a cross-sectional view of an example of such an integrated circuit package 100. As illustrated in FIG. 9, the one heat-transfer semiconductor layer 110 is located on the backside 205 of the active semiconductor device layer 105. In some such embodiments, as illustrated, the active side 115 can includes an array of bond pads 910 with solder bumps 920 attached thereto. Such a package 100, can be a flip-chip package having a variety of different designs that are well known to those skilled in the art, such as flip-chip ball grid array packages. For instance as further illustrated in FIG. 9 the active semiconductor device layer 105 (e.g., an IC die) can be flip-chip bonded via the solder bumps 920 to a substrate 930 which in turn is connected to solder balls 935 of the package 100.

As illustrated, in some embodiments, the one heat-transfer semiconductor layer 110 can substantially cover the entire backside 205 the active semiconductor device layer 105 and thereby provide a heat dissipation pathway while at the same time provide close CTE matching to the active semiconductor device layer 105 to mitigate stress formation in the layer 105 when the package 100 is operated. The solder bumps 920 can be attached to a substrate such as a PCB, such as disclosed in Celik et al. US publication 20090218680, incorporated herein in it entirety.

In some embodiments of the invention, it is preferable for the CTE of heat-transfer semiconductor layer (or layers) to exactly match the CTE of the active semiconductor device layer (e.g., the CTEs differ by less than an about 5 percent, and in some embodiments of the invention, less than an about 1 percent), CTE's of these two layers can still be different from each other, and yet still be substantially matched, and thereby provide advantages as compared to e.g., placing a metal heat spreader on the active semiconductor device layer.

To provide non-limiting examples, in some embodiments of the invention as an IC package 100, a ratio of a CTE of the heat-transfer semiconductor layer to the coefficient of thermal expansion of the active semiconductor device layer is a value in a range of about 0.1:1 to 5:1, and more preferably about 0.3: to about 3:1, even more preferably about 0.6:1 to about 2:1.

For instance, in some embodiments of the invention, the active semiconductor device layer can be composed of silicon (Si) having a CTE of about 3 ppm/° C. and the heat-transfer semiconductor layer (or layers) can be composed of an AlGaAs alloy having a CTE of about 5 ppm/° C. (e.g., a CTE ratio of about 1.7:1), or of Ge having a CTE of about 6 ppm/° C. (e.g., a CTE ratio of about 2:1), or an GaAs alloy having a CTE of about 7 ppm/° C. (e.g., a CTE ratio of about 2.3:1), or an AlSi alloy having a CTE of about 15 ppm/° C. (e.g., a CTE ratio of about 5:1). In some embodiments of the invention, the active semiconductor device layer can be composed of Si having a CTE of about 2.5 ppm/° C. and the heat-transfer semiconductor layer (or layers) can be composed of Si (e.g., scrap silicon, sometimes referred to as a dummy die) having a CTE of about 4.2 ppm/° C. (e.g., CTE ratio of 1.7:1). Or, the active semiconductor device layer can be composed of Si having a CTE of about 4.2 ppm/° C. and the heat-transfer semiconductor layer (or layers) can be composed of Si (e.g., scrap silicon) having a CTE of about 2.6 ppm/° C. (e.g., CTE ratio of 0.6:1). Or, the active semiconductor device layer can be composed of GaAs having a CTE of about 7 ppm/° C. and the heat-transfer semiconductor layer (or layers) can be composed of Si having a CTE of about 2.5 ppm/° C. (e.g., CTE ratio of about 0.3:1). In some embodiments of the invention, the heat-transfer semiconductor layer (or layers) can be composed of an alloy (in some case, e.g., AlSi, AlSiC or SiC) wherein the ratios of the elements of the alloy are adjusted to tailor provide a specific desired CTE to provide the desired degree of CTE match to the active semiconductor device layer.

It is desirable that the thermal conductivity of the heat-transfer semiconductor layer (or layers) be sufficiently high to provide adequate heat dissipation from the active semiconductor device layer during the package's operation to facilitate rapid efficient heat removal. For instance, in some embodiments of the invention, the heat conductivity of the heat transfer layer is equal to or greater than the heat conductivity of the active device. For instance, to provide some non-limiting examples, in some embodiments of the invention as an IC package 100, the ratio of the bulk thermal conductivity (k) of the heat-transfer semiconductor layer to the bulk thermal conductivity of the active semiconductor device is a value in a range of about 1:1 to about 4:1, and in some embodiments of the invention about 1:1 to about 1.5:1.

In some embodiments of the invention, the active semiconductor device layer can be composed of Si having a k of about 140 W/m° K and the heat-transfer semiconductor layer can be composed of Si (e.g., scrap silicon) having a k of about 160 W/m° K (e.g., a k ratio of about 1.1:1). Or, the active semiconductor device layer can be composed of Si having a k of about 140 W/m° K and the heat-transfer semiconductor layer can be composed of AlSi having a k of about 170 W/m° K (e.g., a k ratio of about 1.2:1), or AlSiC having a k of about 180 W/m° K K (e.g., a k ratio of about 1.3:1). Or, the active semiconductor device layer can be composed of GaAs having a k of about 50 W/m° K and the heat-transfer semiconductor layer can be composed of Si having a k of about 150 W/m° K (e.g., a k ratio of about 3:1), or AlSi having a k of about 170 W/m° K (e.g., a k ratio of about 3.3:1), or AlSiC having a k of about 180 W/m° K K (e.g., k ratio of about 3.6:1).

Based on the present disclosure, one skilled in the art would appreciate that a broad combination of different materials of the active semiconductor device layer and the heat-transfer semiconductor layer. However, in some embodiments of the invention, the heat-transfer semiconductor layer (or layers) are composed of a same material as the active semiconductor device layer. As example the active semiconductor device layer and the heat-transfer semiconductor layer (or layers) can all be composed of silicon, to thereby provide substantial or in some embodiments of the invention exact CTE matching. For instance, the one or more heat-transfer semiconductor layer 110 are composed of a same material as the active semiconductor device layer 105 (FIG. 1). For instance, wherein the one or more heat-transfer layers 110 and the other one heat transfer semiconductor layer 210 are both composed of a same material as the active semiconductor device layer 105 (FIG. 3). For instance, the plurality of heat-transfer layers 510, 512, 514 are each composed of a same material as the active semiconductor device layer 105 (FIG. 5). For instance, the plurality of heat-transfer layers 510, 512, 514 and the other heat-transfer layer 710 are each composed of a same material as the active semiconductor device layer 105 (FIG. 7).

As further illustrated in FIGS. 1-9, in some embodiments of the invention, the package 100 is a molded package that further includes a mold material 120 (e.g., a plastic material having a k of about 1 W/mK) surrounding the active semiconductor device layer 105 and the heat-transfer semiconductor layer 110 (or layers 310, 510, 512, 514, 710). In some embodiments of the invention, the heat-transfer semiconductor layer is covered except for an exposed side of the heat-transfer semiconductor layer (e.g., sides 210, 420, 530, 532, 534 or 820) that is opposite a side of the heat-transfer semiconductor layer facing or facing towards (e.g., side 215, 405) the active semiconductor device layer 105 so that heat can be dissipated more efficiently than an over-molded package embodiment. The use of a mold material 120 in combination with the heat-transfer semiconductor layer 110 in an over-molded flip-chip package 100, such as illustrated in FIG. 9, is thought to provide significant cost saving as compared to using a metal heat spreader and improved thermal dissipation as compared to using mold only directly on the back side 205 of the active semiconductor device layer 105.

As also illustrated in FIGS. 1-8, when the package 100 includes a lead frame 140, the mold material 120 can further surround the lead frame 140 and bonding wires 145 connecting the bond pads 127 in the connection zone 125 to lead frame 140, and lead frame wires 147, except for ends 150 of lead frame wires 147 projecting out of the molding material 120.

As further illustrated in FIGS. 2, 4, 6, 8 and 9, some embodiments of the invention as an IC package 100 can further include a metal heat spreader 220 (e.g., one or more copper heat sink or heat pipe) on the heat-transfer semiconductor layer or layers (e.g., layer 110, other layer 310). A heat spreader could be similarly located on the heat-transfer layer or layers of the packages 100 depicted in FIGS. 6 and 8 (e.g., on the layers 510, 512, 514 or other layer 710, respectively). In some embodiments, the metal heat spreader 220 is freestanding on the heat-transfer semiconductor layer or layers. That is, the metal heat spreader 220 is not fixed in place to the heat-transfer semiconductor layer or layers, or to the active semiconductor device layer 105 or to a substrate that the package is mounted on. By being free-standing the heater spreader 220 is able to expand or contract, e.g., when the package 100 is operating or not operating and thereby not impart stresses to the heat-transfer semiconductor layer or layers, or the active semiconductor device layer. In other embodiments of the invention, however, the metal heat spreader 220 can be coupled to the heat-transfer layer or layers by a compliant thermal interface material, such as pliable thermally conductive epoxy to accommodate the expansion and contraction of the metal heat spreader 220.

Figure 10:
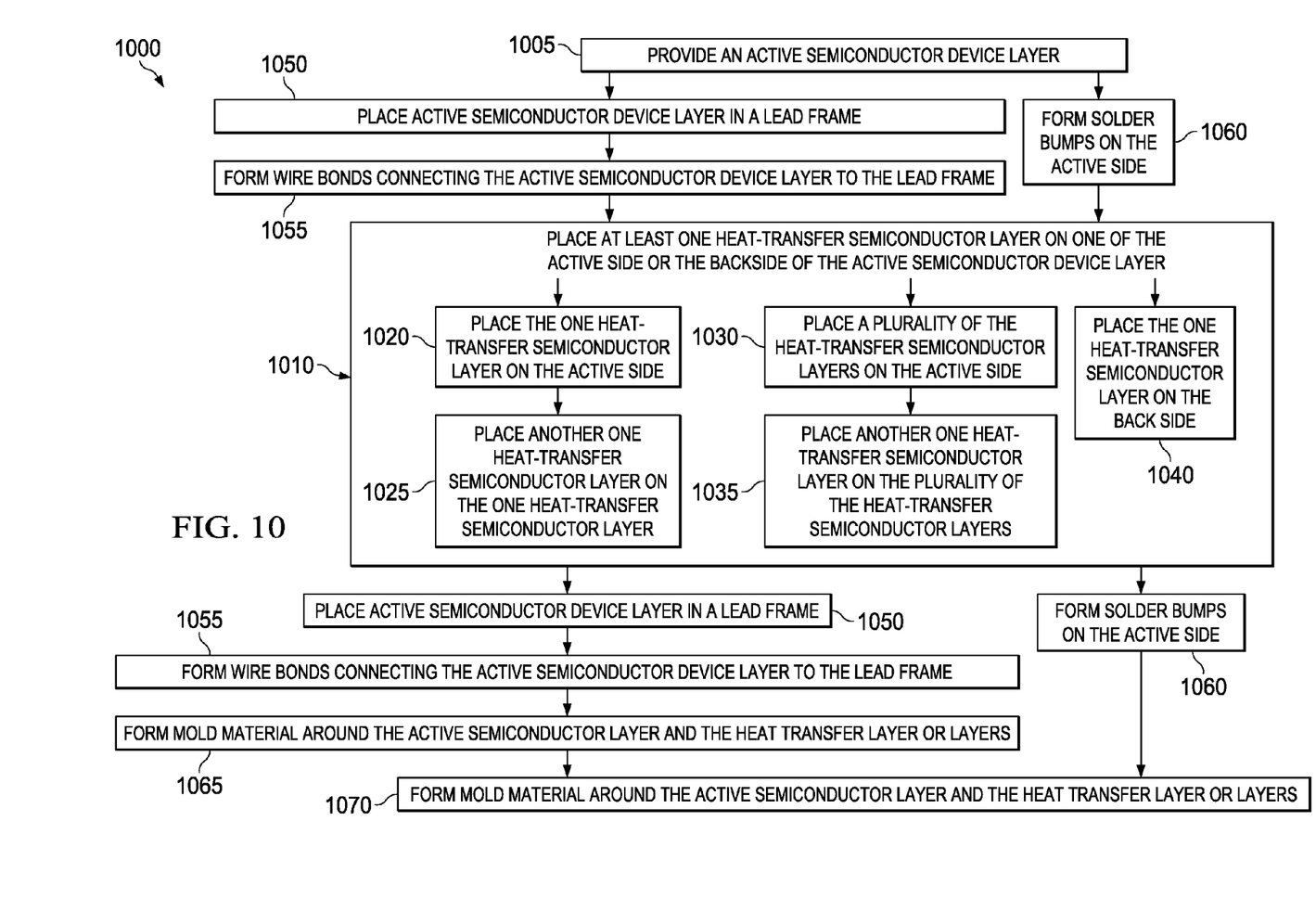
FIG. 10 presents a flow diagram illustrating selective steps in an embodiment of the invention manifest as a method of manufacturing an integrated circuit package of the disclosure such as any of the integrated circuit packages disclosed in FIGS. 1-9.

Another embodiment of the invention is a method of manufacturing an integrated circuit package. FIG. 10 presents a flow diagram illustrating selective steps in an embodiment of the invention as a method 1000 of manufacturing an integrated circuit package of the disclosure such as any of the integrated circuit packages 100 discussed in the context of FIGS. 1-9.

With continuing reference to FIGS. 1-9, the method 1000 comprises a step 1005 of providing an active semiconductor device layer 105. The method 100 also comprises a step 1010 of placing at least one heat-transfer semiconductor layer 110 on the active semiconductor device layer 105. As discussed above, the heat-transfer semiconductor layer 110 has a coefficient of thermal expansion that substantially matches a coefficient of thermal expansion of the active semiconductor device layer 105.

In some embodiments of the invention as a method 1000, the step 1010 of placing at least one heat-transfer semiconductor layer 110 includes attaching the layer 110 to the active side 115 or opposite backside 205 using a thermal epoxy. In other embodiments of the invention, the layer 110 is simply place directly on the active side 115 or opposite backside 205 of the active semiconductor device layer 105 with no intervening material between these layers 105, 110.

In some embodiments of the invention as a method 1000, as part of step 1010, the one heat-transfer semiconductor layer 110 is, placed in step 1020, on the active side 115, a portion of the active side 115 having a connection zone 125 with a plurality of bond pads 127 thereon and the one heat-transfer semiconductor layer 110 covers a remaining portion 130 of the active side 115.

In some embodiments of the invention as a method 1000, as part of step 1010, the one heat-transfer semiconductor layer 110 is placed, in step 1025, on the active side 115, and in step 1025 another one of the heat transfer semiconductor layers 310 is placed on the one heat-transfer semiconductor layer 110. As discussed in the context of FIGS. 3 and 4, the other one heat transfer semiconductor layer 310 has a side 405 facing the active side 115 with a perimeter 410 that is equal to or greater than a perimeter 415 of the active side 115.

In some embodiments of the invention as a method 1000, as part of step 1010, a plurality of the heat-transfer semiconductor layers 510, 512, 514 are placed, in step 1030, on the active side 115. In some embodiments of the invention, a portion of the active side 115 has a connection zone 125 with plurality of bond pads 127 thereon and the plurality of heat-transfer semiconductor layers 510, 512, 514 are located on a remaining portion 130, and in some embodiments of the invention, directly over different hot-spots 120, 140, 124, of the active side 115.

In some embodiments of the invention as a method 1000, as part of step 1010, the plurality of heat-transfer semiconductor layers 510, 512, 514 are placed, in step 1030, on the active side 115, and in step 1035, another one of the heat transfer semiconductor layers 710 is placed on the plurality the heat-transfer semiconductor layers 510, 512, 514. As discussed in the context of FIGS. 3 and 4, the other one heat transfer semiconductor layer 710 can have a side 405 facing the active side 115 with a perimeter 810 that is equal to or greater than a perimeter 815 of the active side 115.

In some embodiments of the invention as a method 1000, as part of step 1010, the one heat-transfer semiconductor layer 110 is placed, in step 1040, on the backside 205 of the active semiconductor device layer 105. In some embodiments of the invention, the active side 115 can includes an array of bond pads 910 with solder bumps 920 attached thereto.

One of ordinary skill would understand that the method 1000 can further include a number of additional steps to complete the manufacture of the package 100.

For instance, in some embodiments of the invention as a method 1000, in step 1045, the active semiconductor device layer 105, with or without the one heat-transfer semiconductor layer or layers thereon, can be placed, in step 1050, on a lead frame 140, and, in step 1055, wire bonds 145 can be formed to connect the layer 105 to the lead frame 140. The placing step 1010 can be performed either before or after steps 1050 and 1055. In other embodiments, such as when the package 100 is a flip-chip package, that does not include a lead frame 140, as part of the method 100, solder bumps 920 can be formed on bold pads 910 on the active side 115, in step 1060, either before or after the placing step 1010.

In some embodiments of the invention, such as when the package 100 is a molded package, in step 1066, a mold material 120 can be formed around the active semiconductor device layer 105 and the heat-transfer semiconductor layer or layers, except for an exposed side of the heat-transfer semiconductor layer or layers (e.g., sides 210, 420, 530, 532, 534 or 820, depending on the embodiment). In some embodiments, in step 1070, a metal heat spreader 220 can be placed on the exposed side of the heat-transfer semiconductor layer or layers.

Although embodiments of the invention have been described herein with reference to the accompanying drawings, it is to be understood that embodiments of the invention are not limited to the described embodiments. Those skilled in the art to which this application relates will contemplate various other embodiments of the invention within the scope of the following claims.

The invention claimed is:

1. An integrated circuit package, comprising:
an active semiconductor device layer; and
at least one heat-transfer semiconductor layer on the active semiconductor device layer, wherein the heat-transfer semiconductor layer has a coefficient of thermal expansion that substantially matches a coefficient of thermal expansion of the active semiconductor device layer, and, the heat-transfer semiconductor layer directly contacts the active semiconductor device layer.

2. The package of claim 1, wherein the one heat-transfer semiconductor layer is located on an active side of the active semiconductor device layer, wherein a portion of the active side has a connection zone with plurality of bond pads thereon and the one heat-transfer semiconductor layer substantially covers a remaining portion of the active side.

3. The package of claim 2, wherein another one of the heat transfer semiconductor layers is located on the one heat-transfer semiconductor layer, wherein the other one heat transfer semiconductor layer has a side facing towards the active side with a perimeter that is equal to or greater than a perimeter of the active side.

4. The package of claim 3, wherein the one or more heat-transfer layers and the other one heat transfer semiconductor layer are both composed of a same material as the active semiconductor device layer.

5. The package of claim 1, wherein a plurality of the heat-transfer semiconductor layers are located on an active side of the active semiconductor device layer, wherein a portion of the active side has a connection zone with a plurality of bond pads thereon and the plurality of heat-transfer semiconductor layers are located on a remaining portion of the active side.

6. The package of claim 5, wherein each one of the heat-transfer semiconductor layers covers a different one of a plurality of hot-spots within the remaining portion on the active side.

7. The package of claim 6, wherein the hot-spots correspond to local areas on the active side that have surface temperatures that are greater that a recommended operating temperature of device components on the active side.

8. The package of claim 6, wherein the hot-spots correspond to local areas on the active side that have a temperature difference as compared to other local areas on the active side that exceed a recommended maximum difference.

9. The package of claim 6, wherein another one of the heat transfer semiconductor layers is located on the plurality of heat-transfer semiconductor layers, wherein the other one heat transfer semiconductor layer has a side facing the active side with a perimeter that is equal to or greater than a perimeter of the active side.

10. The package of claim 5, wherein the plurality of heat-transfer layers are each composed of a same material as the active semiconductor device layer.

11. The package of claim 1, wherein the one heat-transfer semiconductor layer is located on a backside of the active semiconductor device layer, and an active side of the active semiconductor device layer includes an array of bond pads with solder bumps attached thereto.

12. The package of claim 1, wherein a ratio of a coefficient of thermal expansion of the heat-transfer semiconductor layer to the coefficient of thermal expansion of the active semiconductor device layer is a value in a range of about 0.1:1 to about 5:1.

13. The package of claim 1, wherein a ratio of a bulk thermal conductivity of the heat-transfer semiconductor layer to the bulk thermal conductivity of the active semiconductor device is a value in a range of about 1:1 to about 4:1.

14. The package of claim 1, wherein the one or more heat-transfer semiconductor layer are composed of a same material as the active semiconductor device layer.

15. A method of manufacturing an integrated circuit package, comprising:
providing an active semiconductor device layer; and
placing at least one heat-transfer semiconductor layer on the active semiconductor device layer, wherein the heat-transfer semiconductor layer has a coefficient of thermal expansion that substantially matches a coefficient of thermal expansion of the active semiconductor device layer, and the heat-transfer semiconductor layer directly contacts the active semiconductor device layer.

16. The method of claim 15, wherein the one heat-transfer semiconductor layer is placed on an active side of active semiconductor device layer, wherein a portion of the active side has a connection zone with a plurality of bond pads thereon and the one heat-transfer semiconductor layer covers a remaining portion of the active side.

17. The method of claim 16, wherein placing includes placing another one of the heat transfer semiconductor layers on the one heat-transfer semiconductor layer, wherein the other one heat transfer semiconductor layer has a side facing the active side with a perimeter that is equal to or greater than a perimeter of the active side.

18. The method of claim 15, wherein placing includes placing a plurality of the heat-transfer semiconductor layers on an active side of active semiconductor device layer, wherein a portion of the active side has a connection zone with a plurality of bond pads thereon and the plurality of heat-transfer semiconductor layers are located on a remaining portion of the active side.

19. The method of claim 18, wherein placing includes placing another one of the heat transfer semiconductor layers on the plurality of heat-transfer semiconductor layers, wherein the other one heat transfer semiconductor layer has a side facing the active side with a perimeter that is equal to or greater than a perimeter of the active side.

20. The method of claim 15, wherein placing includes placing the one heat-transfer semiconductor layer on a backside of the active semiconductor device layer.

* * * * *